United States Patent [19]

Ikoma et al.

[11] Patent Number: 4,636,824
[45] Date of Patent: Jan. 13, 1987

[54] VOLTAGE-CONTROLLED TYPE SEMICONDUCTOR SWITCHING DEVICE

[75] Inventors: Toshiaki Ikoma, 6-4-16, Honkomagome, Bunkyo-ku, Tokyo; Hajime Maeda, Tokyo; Hisayoshi Yanai, Tokyo; Ryo Dang, Tokyo; Naoyuki Shigyo, Yokohama, all of Japan

[73] Assignees: Toshiaki Ikoma, Tokyo; Tokyo Shibaura Denki Kabushiki Kaisha, Kawasaki, both of Japan

[21] Appl. No.: 850,065

[22] Filed: Apr. 7, 1986

[30] Foreign Application Priority Data

Dec. 28, 1982 [JP] Japan ................... 57-231419
Dec. 28, 1982 [JP] Japan ................... 57-231420

[51] Int. Cl.$^4$ .................................... H01L 29/78
[52] U.S. Cl. ...................... 357/23.14; 357/54; 357/49; 357/59; 357/64; 357/16; 357/42; 357/1; 357/23.1; 357/23.2; 357/23.3; 357/23.7; 357/23.11; 357/23.12; 357/4
[58] Field of Search ............... 357/54 A, 54 M, 49, 357/47, 1, 2, 3, 16, 42, 23.2, 23.14, 23.1, 59, 63, 64, 23.3, 23.7, 23.11, 23.12, 4

[56] References Cited

U.S. PATENT DOCUMENTS

| | | | |
|---|---|---|---|
| 2,791,758 | 5/1957 | Looney | 357/61 X |
| 2,791,759 | 5/1957 | Brown | 357/61 X |
| 2,791,760 | 5/1957 | Ross | 357/61 X |
| 2,791,761 | 5/1957 | Morton | 357/58 X |
| 2,900,531 | 8/1959 | Wallmark | |
| 2,918,628 | 12/1959 | Stvetler | 357/23.1 X |
| 2,933,619 | 4/1960 | Heywang | 357/23.1 X |
| 3,271,591 | 9/1966 | Ovshinsky | 357/1 X |
| 3,385,729 | 5/1968 | Larchian | 357/54 |
| 3,607,466 | 9/1971 | Miyazaki | 357/59 X |
| 3,678,302 | 7/1972 | Kasano et al. | 357/1 X |
| 3,728,592 | 4/1973 | Joshi et al. | 357/63 X |
| 4,054,989 | 10/1977 | Ho et al. | 357/54 X |
| 4,094,057 | 6/1978 | Bhattacharyya et al. | 357/54 X |
| 4,229,756 | 2/1979 | Sato et al. | 357/42 |
| 4,510,516 | 4/1985 | Bartelink | 357/23.11 R |
| 4,543,592 | 9/1985 | Itsumi et al. | 357/49 X |

FOREIGN PATENT DOCUMENTS

| | | |
|---|---|---|
| 1514862 | 9/1969 | Fed. Rep. of Germany . |
| 1789114 | 5/1972 | Fed. Rep. of Germany . |
| 1065953 | 4/1967 | Japan ................... 357/63 X |

OTHER PUBLICATIONS

Sakai, "Velocity Modulation Transistor (VMT)—A New Field-Effect Transistor Concept," *Japanese Journal of Applied Physics,* vol. 21, No. 6, Jun. 1982, pp. L381–L383.

Japanese Journal of Applied Physics, vol. 20, No. 7 (Jul. 1981), "Polytype Superlattices and Multi-Heterojunctions," pp. L529–L532.

*Primary Examiner*—William D. Larkins
*Assistant Examiner*—William A. Mintel
*Attorney, Agent, or Firm*—Oblon, Fisher, Spivak, McClelland & Maier

[57] ABSTRACT

A voltage-control type semiconductor switching device is disclosed which includes a pair of controlled electrodes to which a control voltage signal is supplied, and a semiconductive layer formed between the electrodes so as electrically insulative from the electrodes through insulative layers. The semiconductive layer has a channel region and a carrier-storage region which is substantially nonconductive. The channel region is formed laterally along the longitudinal direction of the electrodes, thereby allowing majority carriers such as electrons of the semiconductive layer to flow in the lateral direction. In the current cut-off mode, the carrier-storage region temporarily stores the carriers which move in the direction of thickness of the semiconductive layer due to the electric field created by the voltage. In the current conduction mode, the carrier-storage region releases the carriers stored therein toward the channel region.

15 Claims, 17 Drawing Figures

VOLTAGE-CONTROLLED TYPE SEMICONDUCTOR SWITCHING DEVICE

This application is a continuation of application Ser. No. 563,978, filed Dec. 20, 1983, now abandoned.

BACKGROUND OF THE INVENTION

1. Field of the Invention

The present invention relates in general to a semiconductor switching device and, more particularly, to a voltage-controlled type semiconductor switching device which controls the amount of current flowing therethrough in accordance with the electric field to be created by a voltage applied between electrodes of the switching device.

2. Discussion of Background

The working speed of a semiconductor integrated circuit is limited fundamentally due to the carrier mobility. Various techniques have been studied to provide an integrated circuit (IC) device utilizing a compound semiconductor, such as GaAs, $Al_xGa_{1-x}As$, or the like in which the electron mobility is higher than that of Si. At present, an electron mobility of up to about 8,000 $cm^2/V\cdot sec$ can be obtained at room temperature. In addition, a technique for cooling an IC device with liquid nitrogen has been proposed to improve electron mobility by a factor of ten or more over conventional devices, thereby increasing the working speed of an IC device.

On the other hand, a known complementary type IC arrangement including n- and p-channel transistors is useful for low electric power consumption of semiconductor IC devices. Complementary IC devices are also excellent in terms of noise margin. However, the working speed of such a complementary type IC device is limited by the lower value between the electron mobility and hole mobility. When the compound semiconductor of the groups III–V (GaAs, etc.) is used in the IC device, the hole mobility is in general merely up to hundreds of $cm^2/V\cdot sec$ at room temperature and. This value is lower than the electron mobility. Therefore, even if the IC device is constituted using GaAs, the feature of high electron mobility will not be utilized which makes it difficult to produce a high working speed IC device. Moreover, there is a problem with the manufacturing process of the complementary IC devices using n- and p-channel transistors as they are more complicated than IC devices using single conductive channel transistors.

A field-effect device having a multi-heterojunction using three semiconductor layers is disclosed in Esaki et al., "*Polytype Superlattices and Multi-Heterojunctions*", Japanese Journal of Applied Physics, Vol. 20, No. 7, (July, 1981), pps. L529-L532. In this device, by applying an external voltage to the specific semiconductor layer, the characteristic of this layer is changed between the semiconductor characteristic and the semimetallic characteristic. Carriers are accumulated in the well of potential thus generated in the semiconductor layer, thereby controlling the current flow along the longitudinal direction of the layer. According to the field-effect device by Esaki et al., however, the carriers are needed to get over the potential barrier caused between two layers in the ON-OFF (i.e. switching) operation mode, and it takes a long time to get over the potential barrier. As a result, there is a limitation for shortening of the switching operation time. Furthermore, in this device, it is impossible to realize the good current cut-off state (with zero current) corresponding to the OFF-state of the transistor.

According to a velocity-modulation transistor of Sakaki, "*Velocity-Modulation Transistor*", Japanese Journal of Applied Physics, Vol. 21, No. 6 (June, 1982), pps. L381-L383, two separate channels A, B having two different mobilities are formed between source and drain of the article, as shown in FIG. 1. By applying a voltage between the channels, the carriers are allowed to move in another channel having smaller mobility, thereby enabling to control of the current flowing between source and drain. However, according to Sakaki et al., the transistor is constructed in such a manner that (a small amount of) low-mobility carriers continue to flow in the channel in the current cut-off state (i.e., in the OFF-state of the transistor). Thus, it cannot be expected to provide good switching operation to selectively turn the current ON and OFF. According to the velocity-modulation transistor, the concept of turning the current ON and OFF (namely, the effort of setting N=0 in the second term of equation (2)) is not considered.

SUMMARY OF THE INVENTION

It is an object of the present invention to provide a new and improved semiconductor switching device which can perform good switching operation by turning ON and OFF the channel current at superhigh speed in response to an external control voltage.

It is another object of the present invention to provide a new and improved semiconductor switching device which can ON/OFF control the channel current at superhigh speed due to the external control voltage and can realize a composite switching device with high working speed and low electric power consumption by utilizing a pseudocomplementary type circuit using a single conductive channel device.

The voltage-controlled type semiconductor switching device according to the present invention comprises: a stacked layer assembly including a first semiconductor layer of a predetermined conductivity type serving as a current channel and a second nonconductive semiconductor layer, provided in contact with the first semiconductor layer, for storing current carriers of the first semiconductor layer. First and second control electrode layers are provided on both side surfaces of that stacked layer assembly through insulative layers, respectively. By applying a voltage across the first and second control electrode layers, current carriers are allowed to move between the first and second semiconductor layers, thereby ON/OFF controlling the channel current.

As the second nonconductive semiconductor layer, there is used, for example, a semiconductor layer in which carrier traps are introduced with high density, thereby to add the nonconductive property thereto, or a semiconductor layer in which a barrier to stop the movement of carriers in the lateral direction along the layer is provided inside, thereby to substantially add a nonconductive property thereto. In the description hereinbelow, the first semiconductor layer is called a current channel layer and the second semiconductor layer is called a carrier-storage layer.

The semiconductor switching device according to the present invention includes two types: the type is which carriers locally exist in the current channel layer when the external control voltage to be applied across the first and second control electrodes is zero; and the type in which carriers locally exist in the carrier-storage layer when the external control voltage is zero. The former is the normally-on type switching device and the latter is the normally-off type switching device. It is determined by the built-in field whether the carriers locally exist in the current channel layer or in the carrier-storage layer when the external control voltage is zero. For generating the above-mentioned built-in electric field, there is provided a technique of introducing interface charges into a region near the interface between the insulative layer and the semiconductor layer, and a technique of selecting the materials of the control electrodes and insulative layers, thereby making the potential difference between the control electrode and semiconductor layer on the side of the current channel layer differ from the potential difference on the side of the carrier-storage layer.

BRIEF DESCRIPTION OF THE DRAWINGS

The present invention is best understood by reference to the accompanying drawings, in which.

DETAILED DESCRIPTION OF THE PREFERRED EMBODIMENTS

Figure 1:
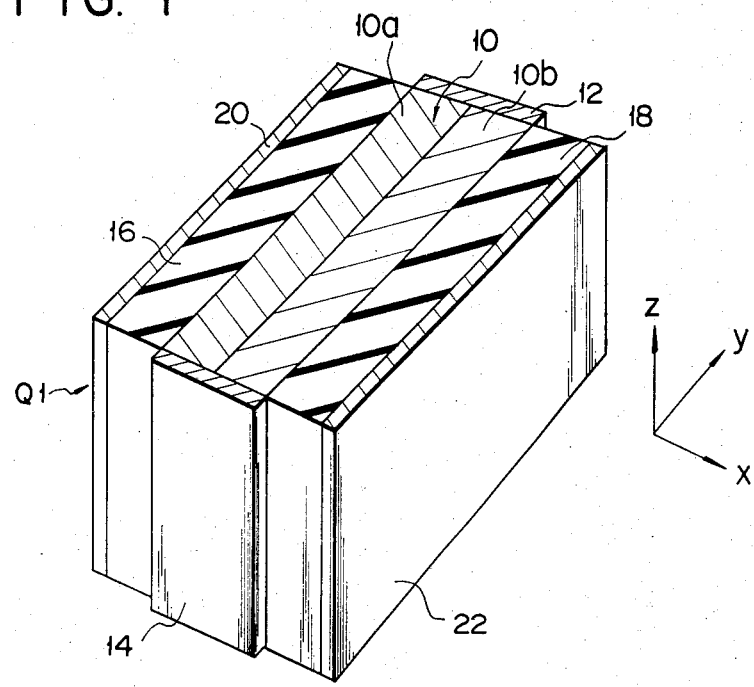
FIG. 1 is a perspective view showing a voltage-controlled type semiconductor switching device according to a first embodiment of the present invention.
Figure 2:
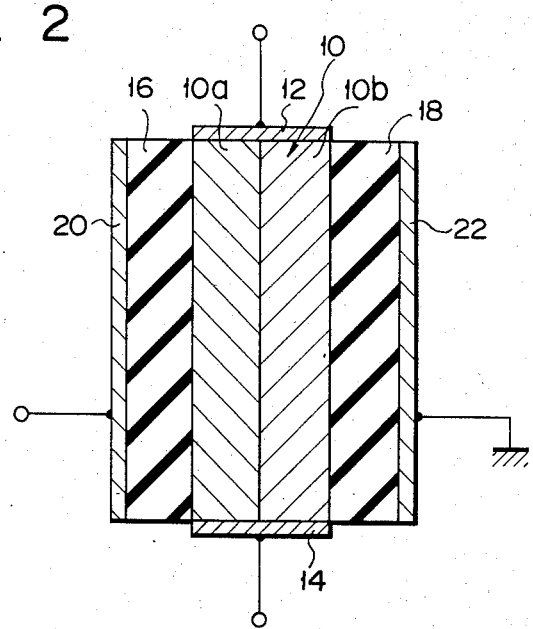
FIG. 2 is a plan view of the semiconductor switching device of FIG. 1.

A voltage-control type semiconductor switching device Q1 according to a first embodiment of the present invention is illustrated in FIGS. 1 and 2. A semiconductor layer 10 has a current channel region 10a and a nonconductive carrier-storage region 10b for temporarily storing current carriers. In this embodiment, two different regions 10a and 10b can be regarded as a channel layer and a carrier-storage layer, respectively. These layers 10a and 10b are successively stacked so as to prevent the formation of a significant potential barrier therebetween. Conductive layers 12 and 14 serving as terminal electrodes are provided on both end portions in the longitudinal direction of the stacked semiconductor configuration. This stacked layer assembly 10 is sandwiched by insulative layers 16 and 18. A pair of control electrode layers 20 and 22 are formed on the exposed surfaces of these insulative layers 16 and 18. Although the spatial coordinate axes were shown in these drawings for convenience of description, the length in the direction of x, i.e. the direction of thickness of the device of FIG. 1 is magnified to the order of about 10 times those of the other two directions of y and z.

In the case where the current channel layer 10a is the n-type semiconductor layer, the carrier-storage layer 10b is formed by introducing the electron traps, having a high concentration, into the n-type semiconductor layer formed successively with the layer 10a by way of ion implantation or other methods. It is also possible to introduce such electron traps by the addition of impurity atoms having deep energy level. In any case, the effective electron trap concentration is set so as to be at least twice the existing donor concentration. Due to such arrangement, even if all of the electrons of the current channel layer 10a are stored, this carrier-storage layer 10b is substantially made nonconductive.

In the switching device thus configurated, when it is assumed that enough strong electric field exists in the direction from the carrier-storage layer 10b to the current channel layer 10a, conduction electrons of the current channel layer 10a move to the carrier-storage layer 10b and are trapped by the electron traps. Thus, the current channel layer 10a is depleted. This causes lack of electrons which contribute to conduction. In this state, even if a voltage is applied across the terminal electrodes 12 and 14, no channel current will flow. In the case where the electric field is opposite to the above case, the electrons are released from the electron traps and then move to the current channel layer 10a to be the conduction electrons. This allows the current to flow between the terminal electrodes 12 and 14. Such electric field can be controlled by applying the external control voltage Vc across the control electrodes 20 and 22, thereby performing the ON/OFF control of the current.

Figure 3:
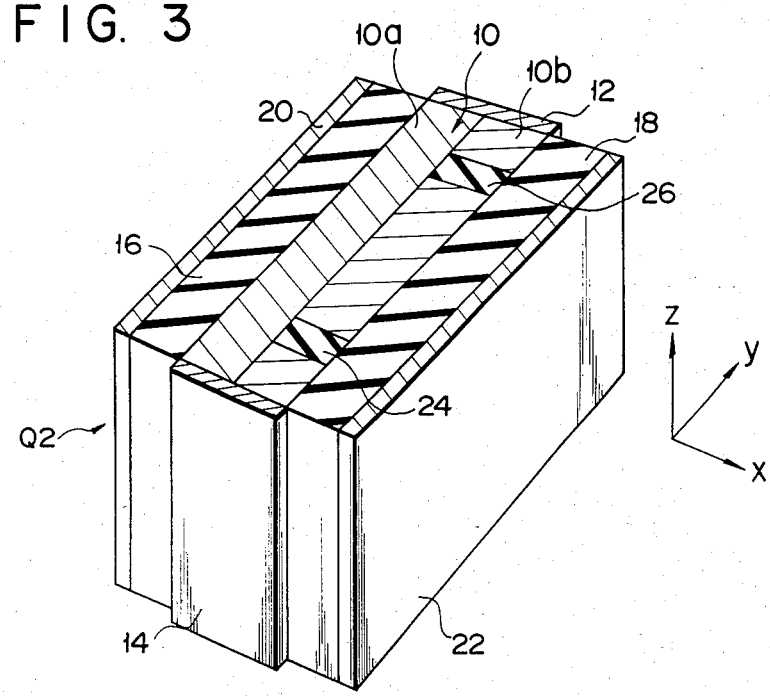
FIG. 3 is a perspective view showing a voltage-controlled type semiconductor switching device according to a second embodiment of the present invention.
Figure 4:
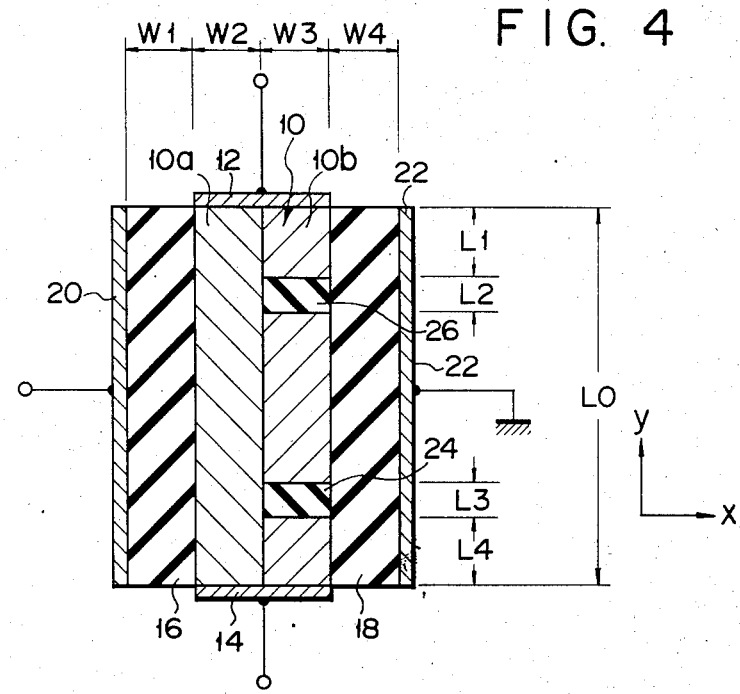
FIG. 4 is a plan view of the semiconductor switching device of FIG. 3.

In the above-mentioned device in which electron trap centers are introduced to realize the carrier-storage layer 10b, it takes a certain time period to release the electrons from the electron traps. This produces a disadvantage for the superhigh speed switching operation. FIGS. 3 and 4 show a second embodiment which can determine the movement of the carriers between the current channel layer and the carrier-storage layer in dependence upon only the drift velocity. In FIGS. 3 and 4, the parts and elements similar to those in the first embodiment shown in FIGS. 1 and 2 are designated by the same reference numerals, and their descriptions are omitted.

According to a voltage-control type semiconductor switching device Q2 shown in FIGS. 3 and 4, insulative regions 24 and 26 are buried in the carrier-storage layer 10b of the same n-type semiconductor layer as the current channel layer 10a. The insulative regions 24 and 26 are buried in the layer 10b so as to cross it from the upper end to the bottom end in the direction of z.

With such a configuration, the insulative regions 24 and 26 form high potential barriers against the movement of electrons in the carrier-storage layer 10b in the y (lateral) direction. That is to say, even when the electrons inside thereof are free electrons, the carrier-storage layer 10b does not contribute to the conduction between the terminal electrodes 12 and 14. Thus, the layer 10b has a substantially non-conductive property. Therefore, similarly to the case already described with respect to the first embodiment, the ON/OFF control of the channel current can be carried out by applying the control voltage across the control electrodes 20 and 22 in such way as to collect the electrons either into the current channel layer 10a or into the carrier-storage layer 10b. The movement of the electrons in this case is unconditionally determined in dependence upon the drift motion or drift velocity. This enables the higher-speed switching operation than the case of the first embodiment in which only the carrier-storage layer 10b shown in FIGS. 1 and 2 is used.

Figure 5A:
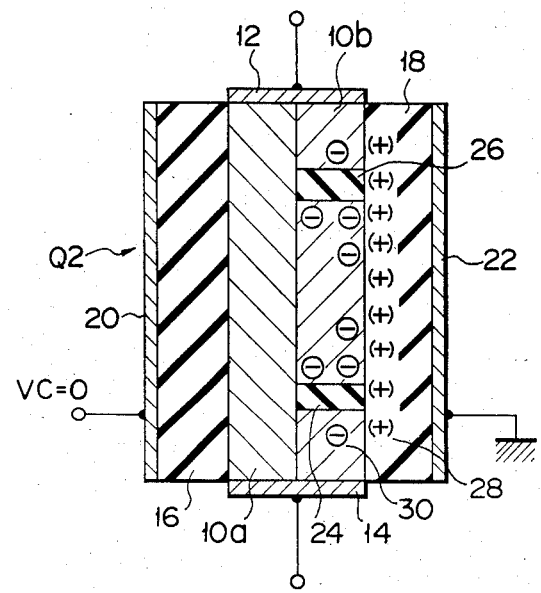
FIGS. 5A and 5B are diagrammatical illustrations showing the distributions of carriers (electrons) in the nonconductive state and in the conductive state of the normally-off type semiconductor switching device having a constitution similar to that of the device of FIG. 3.
Figure 5B:
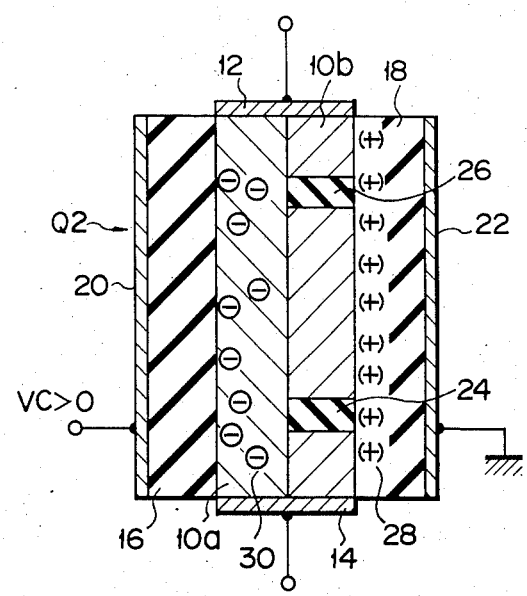

The switching device includes two types: the normally-off type which is rendered nonconductive when the external control voltage is zero; and the normally-on type which is rendered conductive when the external control voltage is zero. In the device of the present invention, it is possible to realize either of the normally-off type and normally-on type by developing a given built-in field in the current channel layer, carrier-storage layer, or these stacked layers. To obtain the normally-off type in each of the above-mentioned embodiments wherein the electrons are used as the carriers, positive interface charges with a proper surface density are formed near the interface of the insulative layer 18 with the carrier-storage layer 10b by way of the implantation of Na ions from the surface of the insulative layer 18, for example. FIGS. 5A and 5B illustrate cross sectional views of the switching device Q2 in this case. In these diagrams, a reference numeral 28 denotes the above-mentioned interface charges. FIG. 5A shows a cross sectional view of the switching device in the case where the control voltage Vc=0, in which electrons 30 locally exist in the carrier-storage layer 10b due to the built-in field by the interface charges 28, so that no channel current flows. On the other hand, FIG. 5B shows a cross sectional view of the device in the case where a given positive voltage was applied as the control voltage Vc to the device; in this case, the externally applied electric field overcomes the built-in field to cause the electrons 30 to move into the current channel layer 10a, thereby contributing to the conduction.

To obtain the normally-on type device, contrarily to the above, the positive interface charges may be formed near the interface of the insulative layer 16 with the current channel layer 10a. With such an arrangement, the electrons locally exist in the current channel layer 10a when the control voltage Vc=0 and by applying a given negative voltage as the control voltage Vc, the channel current can be cut off. It should be noted that the built-in field in the normally-on type device is not necessarily formed, since the ON state at Vc=0 can be realized without localizing the electrons in the current channel layer.

Figure 6:
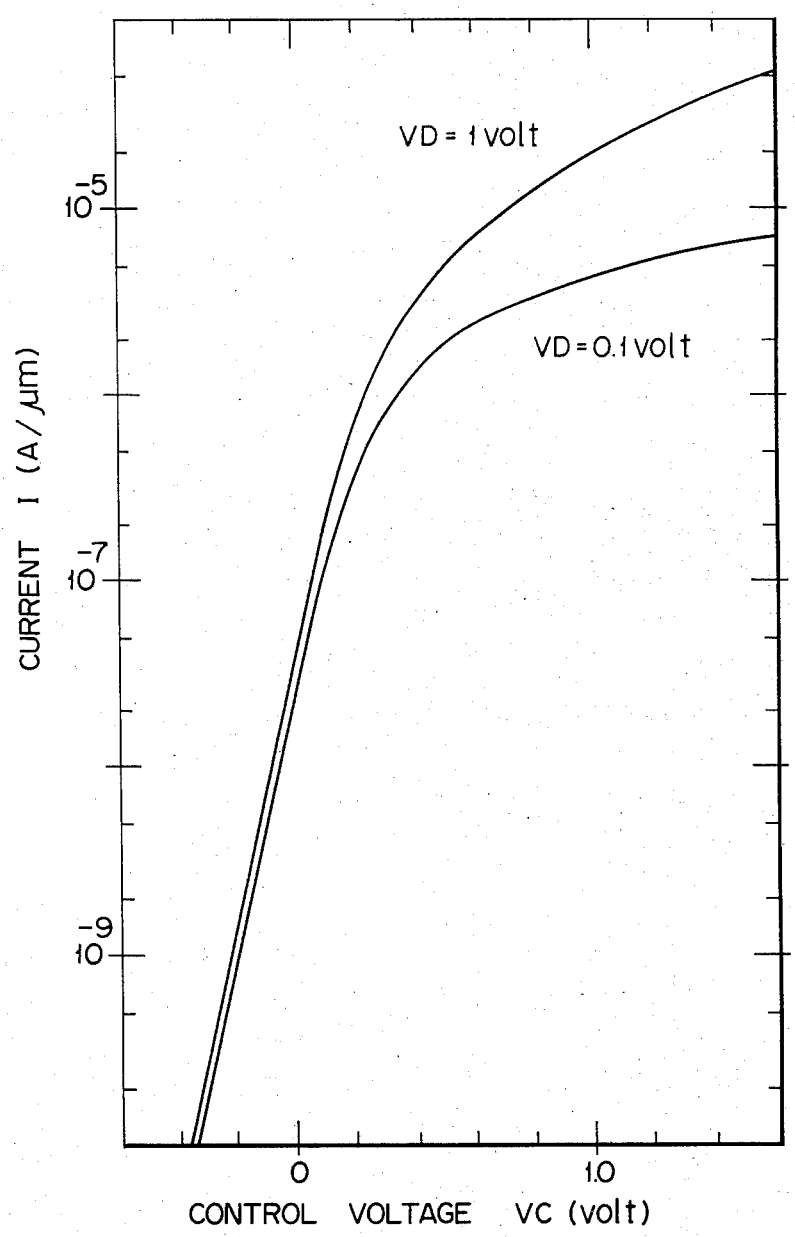
FIG. 6 is a graph showing a current v.s. control voltage characteristic of the device of FIG. 5.

An example of the switching characteristic in the normally-off type device configuration shown in FIGS. 3 and 4 will now be described. n-type silicon (Si) having the donor concentration of $1 \times 10^{16}/cm^3$ is used as the current channel layer 10a and carrier-storage layer 10b, and silicon dioxide ($SiO_2$) is used as the insulative layers 16, 18 and the insulative regions 24, 26. The dimensions of the switching device of FIG. 4 are preferably set as follows: $L0=2.0$ μm, $L1=L4=0.5$ μm, $L2=L3=0.2$ μm, $W1=W4=500$ Å, $W2=W3=800$ Å. The positive charge density near the interface of the insulative layer 18 with the carrier-storage layer 10b is set to $Ns=6 \times 10^{11} cm^{-2}$. FIG. 6 shows the current I - control voltage Vc characteristics in the case where the device defined by the above-mentioned numeric values was used. The current I denotes the value per the width of 1 μm in the direction of z of FIG. 3. As is obvious from this graph, when the voltage $V_D=1.0$ V was applied across the terminal electrodes 12 and 14, the current I increases to about 350 times, i.e. from $5.4 \times 10^{-8}$ A/μm to $1.9 \times 10^{-5}$ A/μm, by changing the control voltage Vc from 0 to 1.0 V. Although a small amount of current flows when the control voltage Vc=0, this is because the tail of the electron distribution along the x direction, which distribution is localized in the carrier-storage layer 10b due to the built-in field, slightly remaining in the current channel layer 10a. This causes a socalled leakage current.

Figure 7:
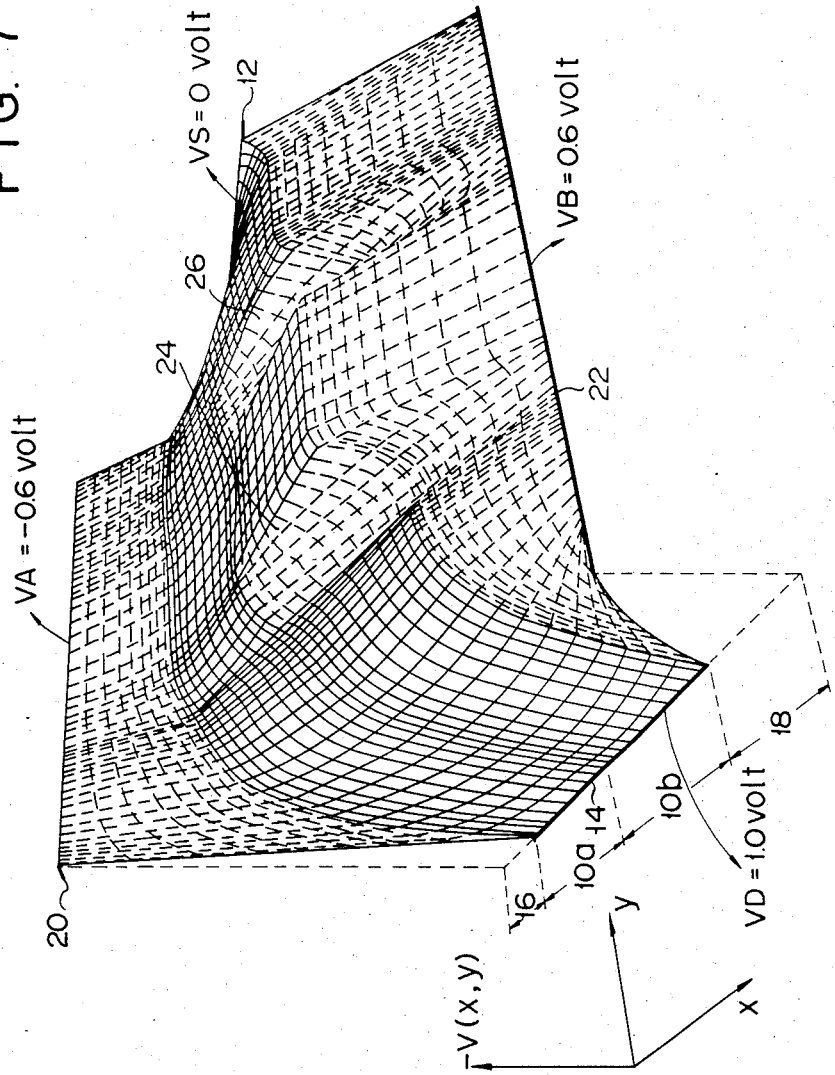
FIG. 7 is a graph showing the internal potential distribution of the semiconductor switching device of FIG. 5, which is rendered nonconductive.
Figure 8:
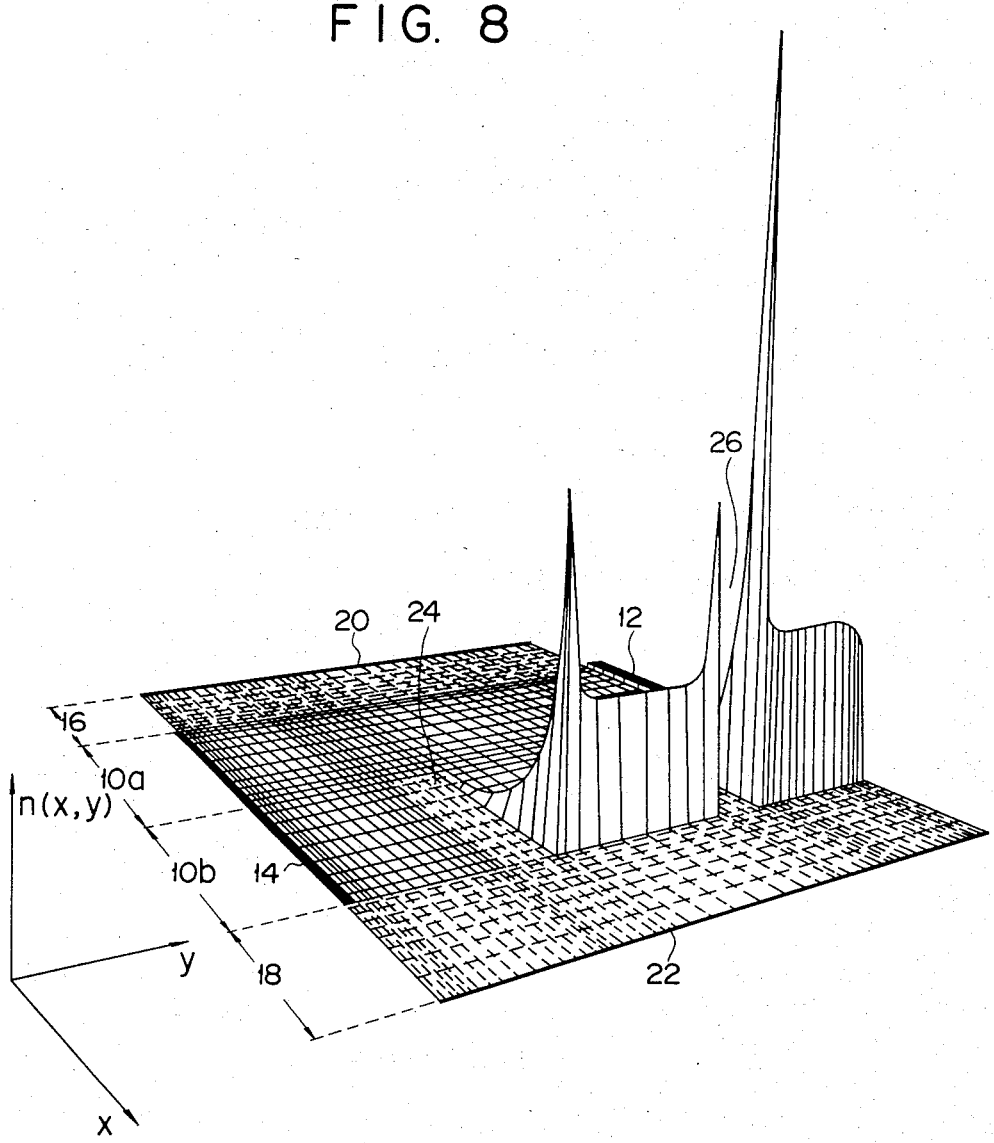
FIG. 8 is a graph showing the distribution of the concentration of electrons in the device of FIG. 5, which is nonconductive.

In the above-described case, when $V_D=1.0$ V and Vc=0, although the voltage larger than the internal voltage in the direction of thickness (in the direction of x) is applied across the electrodes 12 and 14 in the lateral direction (in the direction of y), the device still remains in the OFF state. The electronic mechanism will be described hereinbelow using the computer simulation result. In the computation, the external voltages with good symmetry are used in order to obtain the condition equivalent to the above-mentioned interface charge density Ns. Namely, the voltage $V_A=-0.6$ V is applied to the first control electrode 20, and the voltage $V_B=0.6$ V is applied to the second control electrode 22. The dimensions of the device are substantially the same as the conditions as already described before. FIG. 7 shows the two-dimensional distribution V(x,y) of the voltage potential and FIG. 8 shows the two-dimensional distribution n(x,y) of the concentration of electrons. In any case, the same (x,y) coordinates as those of FIG. 3 are used. To clarify the distinction between the semiconductor layer regions and the insulative layer regions, the former were indicated by the solid lines on the curved surface and the latter were shown by the broken lines. The magnification factor in the direction of x is ten times the direction of y. In the graph of FIG. 7, $-V(x,y)$ is provided, in place of V(x, y), for easy understanding of the change in the potential energy ψ of electrons. There is a large difference in electron energy between the semiconductor layers and the insulative layers. Actually, as the electron potential energy, there exist high plateaus accompanied with vertical walls at the boundary with the portions shown by the solid lines in the portions indicated by the broken lines; these vertical walls form the energy barriers. However, the plateaus are omitted in FIG. 7. In the distribution pattern of potential energy in FIG. 7, the corresponding reference numerals are added to the locations corresponding to the components of the voltage-control type semiconductor switching device of FIGS. 3 and 4.

As can be seen from FIG. 7, the voltage potential $-V$, accordingly the potential energy of electrons $\psi$, is high on the side of the first control electrode 20 due to effect of the built-in field. Thus, as can be seen from FIG. 8, the electrons are put in the region in the carrier-storage layer 10b, which region is near the interface with the insulative layer 18 on the side of the second control electrode 22. As already mentioned before, these electrons do not contribute to conduction since the movement of those electrons in the direction of y is stopped due to the insulative regions 24 and 26 existing in the carrier-storage layer 10b. In addition, as is obvious from FIG. 8, the concentration of electrons is extremely small and a strong depletion is produced in the region between the terminal electrode 14 and the insulative region 24 in the carrier-storage layer 10b. Consequently, as is obvious from FIG. 7, the voltage $V_D$ across the terminal electrodes 12 and 14 is mainly held in this region and the potential gradient in the direction of y is small in the other regions. Furthermore, it will be understood from the potential distribution of FIG. 7 that a low energy barrier of electrons is formed in the region in the current channel layer 10a sandwiched by the insulative layer 16 and insulative regions 24 and 26 in the carrier-storage layer 10b. This energy barrier, in addition to the effects of the potential distribution which have been mentioned so far, provides an effect of further reducing the number of electrons which will contribute to conduction. As a result, this causes the current I to be substantially completely cut off.

Figure 9A:
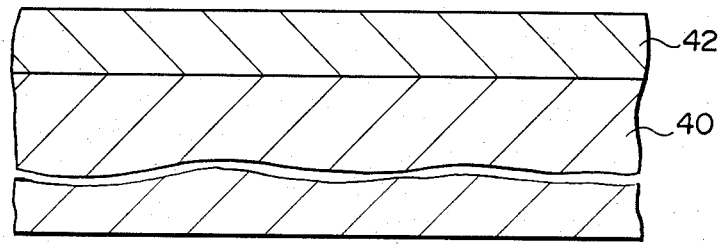
FIGS. 9A to 9D are diagrams showing, in schematic cross section, some of major steps in the fabrication of a practical example of the voltage-controlled type semiconductor switching device of the second embodiment shown in FIGS. 3 and 4.
Figure 9B:
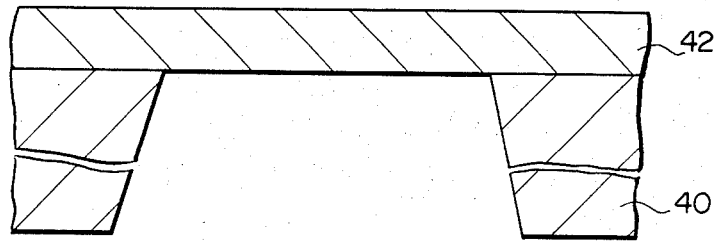
Figure 9C:
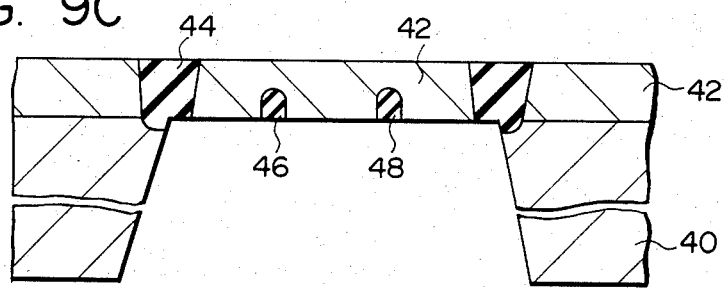
Figure 9D:
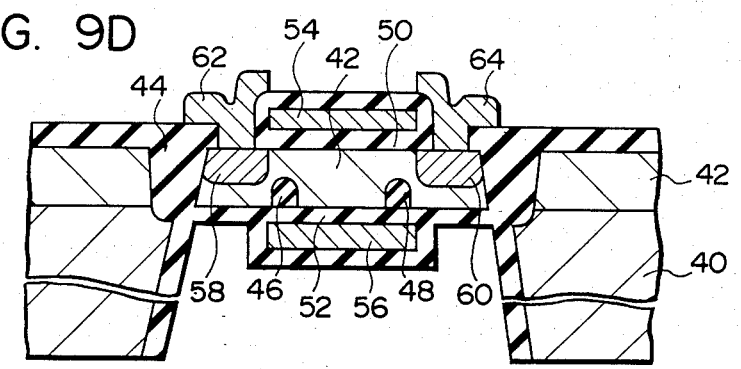

A practical example of the high-speed switching device as the second embodiment shown in FIGS. 3 and 4 will be described with reference to FIGS. 9A to 9D. Firstly, as shown in FIG. 9A, there is prepared a wafer in which an n-type layer 42 was epitaxially grown on a p+-type Si substrate 40. The n-type layer 42 includes donor impurities of $1 \times 10^{16}$ cm$^{-3}$ and has a thickness which is equal to the sum of design thicknesses of the previously-mentioned current channel layer 10a and carrier-storage layer 10b. The p+-type substrate 40 in the device-forming region of this wafer is etched in the manner as shown in FIG. 9B for allowing both side surfaces of the n-type layer 42 to be exposed. Thereafter as shown in FIG. 9C, a field isolation layer 44 made of SiO$_2$ is formed, from the surface side, to surround the switching device region in accordance with a selection oxidation technique or the like. Moreover, SiO$_2$ layers 46 and 48 serving as the electron energy barriers in the carrier-storage layer are buried in the n-type layer 42 from the rear surface thereof. Thereafter as shown in FIG. 9D, control electrodes 54 and 56 consisting of conductive material such as polycrystalline Si are formed on both side surfaces of the n-type layer 42 through SiO$_2$ layers 50 and 52, respectively. Then n+-type layers 58 and 60 are formed by diffusion to provide the current terminal electrodes. Terminal electrodes 62 and 64 are formed.

As a result of this, the voltage-controlled semiconductor switching device is obtained wherein the surface side of the n-type layer 42 is used as the current channel layer and the back surface side of which the SiO$_2$ layers 46 and 48 were buried is used as the carrier-storage layer. The selection between the normally-on type and normally-off type is determined by performing the Na ion implantation from the top surface or back surface at a proper acceleration voltage at the stage where the SiO$_2$ layers 50 and 52 are formed.

According to the switching devices as described above, unlike a conventional type of MOS switching transistor the switching speed of which is determined in dependence upon the transit time of carriers in the lateral direction between source-drain, the speed of ON-OFF operation, i.e. the switching operation of the present devices are determined by the time of carrier movement in the direction of thickness of the layers between the thin current channel region 10a and carrier-storage region 10b, which are in direct contact with each other. Therefore, the average distance of movement of the carriers when the semiconductor devices of the present invention selectively turn ON and OFF the current is maintained up to the distance which is equal to the sum of the thickness of the two different layers 10a and 10b. It is possible to easily realize the thickness of each layer having a value not exceeding hundreds of Å by utilizing the recent thin-film manufacturing technology such as molecular beam epitaxy. Therefore, according to the present invention, it is possible to provide the voltage-control type semiconductor switching devices which can satisfactorily repeat the current conduction and current cut-off at superhigh speed. On the other hand, in the conventional MOS switching transistors, the distance between source-drain thereof is ordinarily several $\mu$m and even if the newest microlithography technology is used, its distance will be in the order of submicron. Consequently, for improvement in the switching speed of the conventional MOS transistors, there is a limitation caused from the dimensional limit of the source-drain distance.

Figure 10:
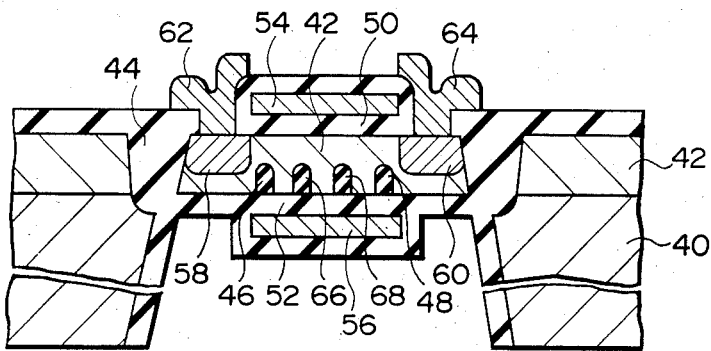
FIG. 10 is a diagram showing the cross sectional constitution of another practical example of the second embodiment device.

In particular, in the second embodiment shown in FIGS. 3 and 4, insulative portions 24 and 26 serving as the carrier stopper to inhibit the flow of the carriers in the lateral direction are additionally formed in the carrier-storage region 10b, whereby carriers which have been once moved in the region 10b due to the internal field are localized more securely by those stoppers 24 and 26. This enables the non-conductivity (current cut-off characteristic) of the device in the current cut-off mode to be advantageously improved. As another example illustrated in FIG. 10, by providing a greater number of (e.g. four) carrier stoppers 46, 48, 66, and 68 in the carrier-storage region so as to, for example, keep the equal distances, it is possible to expect to further improve the switching speed and current cut-off characteristic (characteristic in the OFF-state). This is because, with an increase in the number of these carrier stoppers, the movement in the lateral direction of the carriers which have been moved in the storing region in the switch-OFF mode can be prevented with an increased certainity. When an external voltage is applied so that the switching device is turned OFF, the carriers are trapped between these stoppers so as to be substantially uniformly localized with uniform carrier density. When this device is next turned ON, time required to release the carriers to the channel region to cause the channel region to be rendered conductive uniformly will be shortened, thereby realizing the high-speed switching rate.

In addition, the semiconductor devices according to the present invention are the voltage-controlled type and their power consumption is inherently low. Furthermore, both normally-on type and normally-off type using only one type of carriers as the conduction carriers are provided, so that the pseudocomplementary type circuit can be constituted by combining the normally-on type device and normally-off type device of the same conduction channel. Therefore, according to the present invention, the selection of the conductivity type having large mobility enables various kinds of superhigh speed logical circuits or storage devices or the like having low power consumption to be realized as an integrated circuit. This also enables the combination of the pseudocomplementary type circuit constituted by only electrons and the pseudocomplementary type circuit constituted by only positive holes, so that this allows the freedom of designing integrated circuits to be increased.

Figure 11:
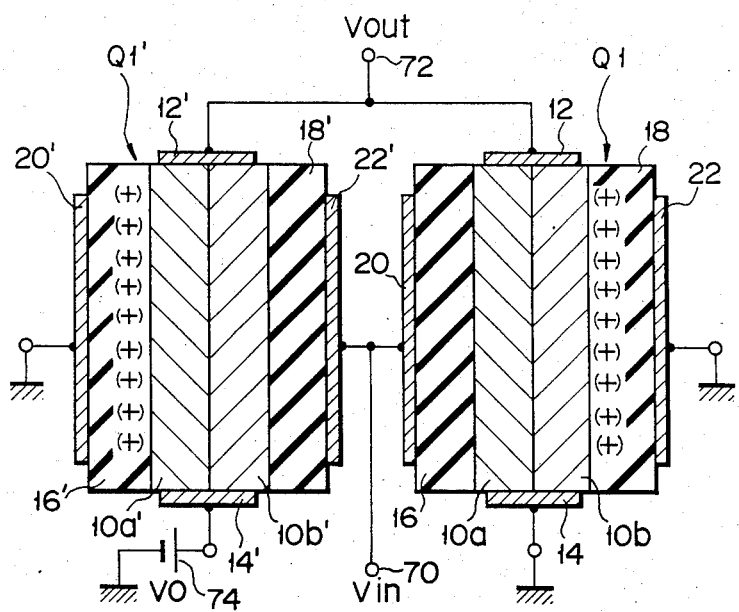
FIG. 11 is a diagram showing the pseudocomplementary type inverter which is constituted using the two voltage-control type semiconductor switching devices according to the present invention.

FIG. 11 illustrates a pseudocomplementary type inverter utilizing, for example, the two voltage-controlled type semiconductor switching devices of the first embodiment. In FIG. 11, Q1 designates a normally-off type switching device in which positive interface charges are formed in the insulative layer 18 on the side of the carrier-storage layer 10b and in which the electrons are used as the carriers. On the other hand, Q1' represents a normally-on type switching device in which positive interface charges are formed in an insulative layer 16' on the side of a carrier-current channel layer 10a' and in which electrons are used as the carriers. In the inverter of FIG. 11, a second control electrode 22 of the device Q1 and a first control electrode 20' of the device Q1' are grounded. The first control electrode 20 of the device Q1 and the second control electrode 22' of the device Q1' are connected together and are connected to a signal input terminal 70 to which an input voltage Vin is supplied. Terminal electrodes 12 and 12' on each one side of the devices Q1 and Q1' are commonly connected together and are connected to a signal output terminal 72 at which an output voltage Vout appears. The other terminal electrode 14 of the device Q1 is grounded, while the other terminal electrode 14' of the device Q1' is connected to a power source 76. A positive voltage $V_0$ is applied to the terminal electrode 14'.

When the input voltage signal Vin to the inverter of FIG. 11 is zero, the device Q1' is conductive (ON state) since the electrons exist in a channel layer 10a'; on the other hand, the device Q1 is nonconductive (OFF state) since the electrons are localized in the carrier-storage layer 10b. Therefore, the output voltage signal Vout of the inverter at this time is substantially equal to the source voltage $V_0$ to be applied to the terminal electrode 14' of the device Q1'. When the input voltage signal Vin exceeds a predetermined positive voltage value, the electrons move into the carrier-storage layer 10b' in the device Q1', causing this device Q1' to be nonconductive. At this time the other device Q1 becomes conductive since the electrons are released to the channel region 10a. Thus, the output voltage signal Vout of the inverter becomes zero.

As described above, the inverting operation is performed with a device constructed as shown in FIG. 11. In the above-described operation, since when one of the devices Q1 and Q1' is ON, the other is OFF, no current will flow and this results in an extremely small amount of electric power loss. The carriers which concern to the above-mentioned operation are only the electrons having high mobility. The state transition depends upon the movement of the electrons in a short distance in the direction of thickness of the semiconductor layers. Therefore, the superhigh speed operation is possible. It should be noted that, for the structure wherein the devices Q1 and Q1' constituting the inverter are together integrated, it may be possible to adopt a stacked layer configuration or a structure in which they are arranged like a plane.

In the above-mentioned examples, n-type Si is used as a semiconductor material. However, other semiconductor materials may also be used. Among them, the use of the compound semiconductor of groups III–V and their mixed crystals having large electron mobility are more advantageous in the high-speed operation. In this case, the material which has a large energy band gap and which is preferably matched with the semiconductor material with respect to the crystal lattice constant may be selected to form the insulative layers. This enables the single-crystal growth technology such as the molecular beam epitaxy method or MOCVD method to be applied to the formation of the layer structure, thereby enabling devices with high performance to be obtained. Such an embodiment will be described hereinbelow.

In the device structure of FIG. 3, at first the AlSb single-crystalline substrate is prepared, which has a thickness equal to the sum of the thicknesses of the insulative layer 18 and insulative regions 24 and 26. The substrate is etched to form the convex portions corresponding to the insulative regions 24 and 26 of FIG. 3. Then, the n-type InAs layer including the donor impurities of $1 \times 10^{16}$ cm$^{-3}$ is allowed to grow by way of the molecular beam epitaxy method, thereby forming the portions corresponding to the carrier-storage layer 10b and current channel layer 10a of FIG. 3. The convex portions to be formed corresponding to the convex portions of the current channel layers are eliminated by way of etching, thereafter the AlSb layer corresponding to the insulative layer 16 of FIG. 3 is allowed to grow again by way of the molecular beam epitaxy method. In the final step, predetermined electrodes are formed, thereby completing the formation of the device.

Figure 12:
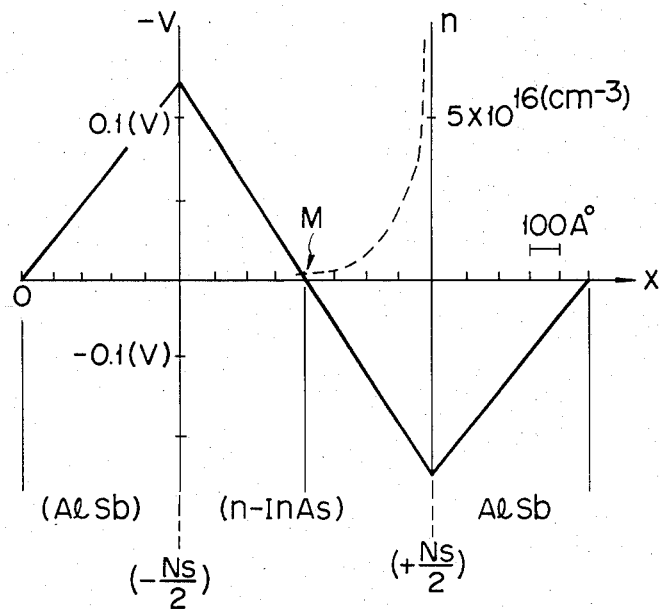
FIG. 12 is a graph showing the potential and the electron concentration distribution in the voltage-control type semiconductor switching device which has the same constitution as that of the device shown in FIGS. 3 and 4 and which is made of a compound semiconductor.

FIG. 12 shows the distribution of the electron concentration n (indicated by the broken line) and the potential distribution (indicated by the solid line) in the normally-off type device thus obtained in this way when the control voltage Vc is zero. The AlSb layers as the insulative layers have thicknesses of 500 Å, respectively. The carrier-storage layer portion and current channel layer portion of the n-InAs layer are 400 Å in thickness, respectively. The interface charge density Ns in the AlSb layer on the side of the carrier-storage layer is as follows: $N_s = 8 \times 10^{11}$ cm$^{-2}$. The electrons are collected to the right from point M of FIG. 12, i.e. in the carrier-storage layer. For illustrative purposes, FIG. 12 also shows the distribution of the potential V, which distribution corresponds to the case where the interface charges of $-N_s/2$ and $+N_s/2$ are respectively distributed to the interfaces of the AlSb layers on both sides in consideration of the symmetrical structure; the change of V in the semiconductor layers is the same as that in the case mentioned hitherto. When the control voltage Vc = 1.405 V is applied to the first control electrode of this device, the changes of n and $-V$ in the InAs layer are such that the right and left are inverted with respect to point M of FIG. 12, allowing the sufficient amount of electrons to be collected in the current channel layer. It should be noted that a normally-on type device will be obtained by forming the positive interface charges in the interface of the AlSb layer on the side of the current channel layer in the same structure as above.

Figure 13:
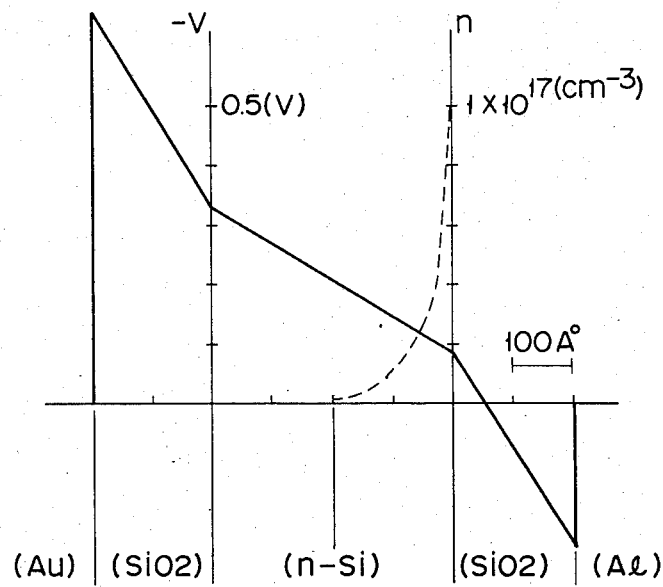
FIG. 13 is a graph showing the potential and the electron concentration distribution in a normally-off type voltage-control type semiconductor switching device which has the same configuration as that of the device illustrated in FIGS. 3 and 4 and in which the built-in electric field is formed in accordance with a method different from that for the device shown in FIGS. 5A and 5B.

An example will now be described whereby the built-in field is formed without introducing the interface charges by way of ion implantation. As is well known, the potential difference between metal and semiconductor in the MIS structure varies in dependence upon the work function of metal, and the electron affinities of insulative material, and semiconductor. Therefore, the suitable selection of materials in each of the above-described embodiments enables the potential gradient to be formed in the semiconductor layers. To be mentioned as a practical example, a sample of n-type Si having a thickness of 400 Å and having donor impurities of $1 \times 10^{16}$ cm$^{-3}$ is prepared and SiO$_2$ films each having a thickness of 200 Å are formed on both side surfaces of this sample, respectively; thereafter, an Au electrode is formed as the first control electrode and an Al electrode is formed as the second control electrode. The distributions of the potential V and the electron concentration n in the direction of x at this time are shown by the solid line and broken line in FIG. 13, respectively. As illustrated in the graph, the internal field is formed and the half of the n-type Si layer on the Au electrode side is sufficiently depleted, while the electrons locally exist in the half on the Al electrode side. Assuming that the half on the Al electrode side is the carrier-storage layer to which the nonconductivity was added as in the previously-described embodiment, the normally-off type device is obtained. On one hand, assuming that the half on the Au electrode side is the carrier-storage layer, the normally-on type device is obtained. These devices can be ON/OFF controlled by the control voltage of 0.9 V with proper polarity.

Although the present invention has been shown and described with respect to particular embodiments, various changes and modifications which are obvious to a person skilled in the art to which the invention pertains are deemed to lie within the spirit and scope of the invention.

In the description according to the above embodiments, the inverter having two switching devices has been introduced as an example of application of the voltage-control type semiconductor switching device of the present invention. However, it is possible to constitute various kinds of logical circuits, storage devices, or the like by combining three or more devices by applying the semiconductor device according to the present invention. Furthermore, it is possible to constitute the similar device using p-type semiconductors in the case where it is more advantageous to use the positive holes in terms of mobility or other reasons. Therefore, to realize a functional device by combining a plurality of devices, it may be possible to combine the devices using the electrons and the devices using the positive holes if necessary.

What is claimed is:

1. A semiconductor switching device which selectively switches between a current conduction state and a current cut-off state in order to perform an ON/OFF switching operation, said device comprising:
   (a) a semiconductor layer having a length and main surfaces and side surfaces, said semiconductor layer comprising,
   a first semiconductive layer section serving as a current channel region for allowing majority carriers of said semiconductor layer to flow therethrough in a lateral direction, and
   a second semiconductive layer section, formed laterally along the length of said semiconductor layer and is in contact with said first semiconductor layer section, wherein said second semiconductor layer section serves as a nonconductive carrier-storage region which temporarily stores the carriers flowing in said first semiconductor layer section, said second semiconductive layer section comprising an insulative layed component buried in said second layer section, for forming potential barriers high enough to prevent the lateral movement of the stored carriers through said second semiconductive layer section;
   (b) terminal electrodes provided on said side surfaces of said semiconductor layer, said terminal electrodes serving as source and drain electrodes of said device; and
   (c) a pair of conductive layers for sandwiching said semiconductive layer at the main surfaces thereof and being electrically insulated from said first and second semiconductive layer sections, said conductive layers serving as control electrodes for (1) receiving a control voltage signal whose voltage level changes between a first and a second level, and for (2) creating, in said semiconductor layer along the lateral direction, an electric field, which causes the carriers to move in the direction of the thickness of said semiconductive layer to be stored in said second semiconductive layer section, when the control voltage signal has said first level, thereby causing said switching device to be turned off, and for (3) releasing the stored carriers toward said first semiconductive layer section to thereby cause said switching device to be turned on when the voltage has the second voltage level.

2. The device according to claim 1, wherein said first and second layer sections have a predetermined conductivity type, and said second layer section comprises a semiconductor material having carrier traps by which the carriers flow through said first layer section are trapped to cause said first layer section serving as said current channel region to be depleted.

3. The transistor according to claim 2, wherein said second layer section includes a means for maintaining a nonconductive state even if the carriers flowing through said first layer section are stored in said second layer section.

4. The device according to claim 1, wherein said first layer section comprises a semiconductor material having a predetermined conductivity type, and said region layer section comprises a semiconductor material which is the semiconductor material of the same conductivity type having carrier traps and which substantially maintains a nonconductive state even if said second layer section stores the carriers flowing through said first layer section, thereby preventing a potential barrier from being formed between said first and second layer sections.

5. The device according to claim 4, wherein said semiconductor layer has a thickness smaller than the length distance thereof, so that a first time corresponding to the switching time of said device, which is needed for the carriers to move between said first and second layer sections in the direction of the thickness of said semiconductive layer, is shorter than a second time required for the carriers to move laterally between the source and drain electrodes.

6. The device according to claim 1, wherein said blocking means comprises:
insulative layer means, formed in said second layer section so as to extend substantially across said second layer section, for restricting the movement of the carriers existing in said second layer section, thereby causing said second layer section to be nonconductive.

7. The device according to claim 6, wherein said insulative layer means includes a plurality of insulative layers which are buried in said second layer section so as to be aligned along the lengthwise direction of said second layer section, whereby the transit speed of the carriers between said first and second layer sections is determined mainly by the drift motion in said semiconductive layer, the direction of said drift motion being substantially perpendicular to the lengthwise direction of said semiconductive layer.

8. The device according to claim 7, wherein said semiconductor layer has a thickness smaller than the length distance thereof, so that a first time corresponding to the switching time of said device, which is needed for the carriers to move between said first and second layer sections in the direction of the thickness of said semiconductive layer, is shorter than a second time required for the carriers to move laterally between the source and drain electrodes.

9. The device according to claim 6, wherein said second semiconductive layer section comprises:
a plurality of insulative layer components buried in said second layer section so as to be aligned along the length thereof.

10. A semiconductor logical device comprising:
(a) a first voltage-controlled type semiconductor switching element comprising,
(i) a pair of first conductive layers, arranged to face each other, for receiving a control voltage whose voltage level changes between a first and a second level, and
(ii) a first semiconductor layer which is provided between said first conductive layers to be electrically insulated therefrom, said first semiconductor layer having a first layer section which is formed along the length of said first semiconductor layer and serves as a first current channel region for allowing first majority carriers of said first semiconductor layer to flow in a lateral direction, and a second layer section which is arranged in the lateral direction to be in contact with said first layer section and which has at least a first insulative layer component which extends substantially across said second layer section to prevent the flow of the first majority carriers in said second layer section, wherein, when the control voltage has the first level, said second layer section temporarily stores the carriers which move in the direction of the thickness of said first semiconductor layer due to an electric field created by the control voltage and said insulative layer component prevents the carriers stored therein form flowing in the lateral direction in said second layer section thereby causing said first layer section to be non-conductive, and when the control voltage signal has the second voltage level, said second layer section releases the stored carriers toward said first layer section; and
(b) a second voltage-controlled type semiconductor switching element comprising,
(i) a pair of second conductive layers, arranged to face each other, for receiving the control voltage, and
(ii) a second semiconductor which is provided between said second conductive layers to be electrically insulated therefrom, said second semiconductor layer having a third layer section which is formed along the length of said second semiconductive layer and serves as a second current channel region for allowing second majority carriers of said second semiconductor layer to flow in the lateral direction, and a fourth layer section which is arranged in the lateral direction to be in contact with said third layer section and which has at least a second insulative layer component which extends substantially across said fourth layer section to prevent the flow of the second majority carriers in said fourth layer section, wherein, when the control voltage has the second level, said fourth layer section temporarily stores the second majority carriers which move in the direction of the thickness of said second semiconductor layer due to an electric field created by the control voltage and said said second insulative layer component prevents the stored carriers from flowing in the lateral direction in said fourth layer section thereby causing said third layer section to be non-conductive, and when the control voltage signal has the first voltage level, said fourth layer section releases the stored carriers toward said third layer section, whereby said first and second switching elements are connected in order to form a complementary type switching transistor circuit.

11. The device according to claim 10, wherein said second layer section maintains a nonconductive state even if the first majority carriers are stored in said second layer section.

12. The device according to claim 11, wherein said fourth layer section serves as a nonconductive state even if the second majority carriers are stored in said fourth layer section.

13. The device according to claim 10, wherein said first and second blocking means comprise:
first and second carrier traps formed in said second and fourth layer sections respectively, for trapping the first and second majority carriers, respectively.

14. The device according to claim 10, wherein
a plurality of insulative layer components are formed in said second layer section so as to be aligned along the length of said second layer section, each of said insulative layers components extending substantially across said second layer section.

15. The device according to claim 14, wherein a plurality of insulative layer components are formed in said fourth layer section so as to be aligned along the length of said fourth layer section, each of said insulative layer components extending substantially across said fourth layer section.

* * * * *